United States Patent [19]

Moustakas et al.

[11] 4,407,710

[45] Oct. 4, 1983

[54] HYBRID METHOD OF MAKING AN AMORPHOUS SILICON P-I-N SEMICONDUCTOR DEVICE

[75] Inventors: Theodore D. Moustakas, Berkeley Heights, N.J.; Don L. Morel, Woodland Hills, Calif.; Benjamin Abeles, Princeton, N.J.

[73] Assignee: Exxon Research and Engineering Co., Florham Park, N.J.

[21] Appl. No.: 311,546

[22] Filed: Oct. 15, 1981

[51] Int. Cl.[3] .................... C23C 15/00; H01L 31/18
[52] U.S. Cl. .............................. 204/192 S; 136/258; 204/192 P; 357/2; 357/30; 427/39; 427/74; 427/86
[58] Field of Search ............ 136/258 AM; 357/2, 30; 29/572; 427/39, 74, 86; 204/192 S, 192 P

[56] References Cited

U.S. PATENT DOCUMENTS 4,064,521  12/1977  Carlson ............................ 357/2
4,339,470   7/1982  Carlson ............................ 427/39
4,342,044   7/1982  Ovshinsky et al. .................. 357/2

OTHER PUBLICATIONS

"Factors Influencing the Efficiency of Amorphous Silicon Solar Cells," Journal of Non-Crystalline Solids, 35-36 (1980), pp. 707-717.

Primary Examiner—Aaron Weisstuch
Attorney, Agent, or Firm—Paul E. Purwin; Ronald D. Hantman

[57] ABSTRACT

The invention is directed to a hydrogenated amorphous silicon PIN semiconductor device of hybrid glow discharge/reactive sputtering fabrication. The hybrid fabrication method is of advantage in providing an ability to control the optical band gap of the P and N layers, resulting in increased photogeneration of charge carriers and device output.

19 Claims, 3 Drawing Figures

HYBRID METHOD OF MAKING AN AMORPHOUS SILICON P-I-N SEMICONDUCTOR DEVICE

BACKGROUND OF THE INVENTION

The invention is a result, in part, of research performed for the U.S. Department of Energy under contract no. XZ 0 9219.

The present invention relates to amorphous silicon, and more particularly to a PIN amorphous silicon semiconductor device having a particularly constructed p and/or n region to improve the photovoltaic output of the device.

Hydrogenated amorphous silicon is a promising candidate for thin film semiconductor applications, and in particular, thin film photovoltaic applications. The discovery that an amount of hydrogen incorporated into the bonding structure of the amorphous silicon thin film results in a substantial increase in the photoconductivity of the semiconductor brought numerous applications of this material to the art. One of the more successful photovoltaic applications of amorphous silicon is the configuration generally referred to as a PIN structure. The term PIN structure, as used herein and generally recognized in the art, refers to the semiconductor structure having an intrinsic (updoped) region of semiconductor material disposed between an n-doped region and a p-doped region of the semiconductor material. The structure is recognized as resulting in higher Voc and $I_{sc}$ as compared to p-n junctions or the like. The present invention is directed to a PIN homojunction whose particular construction of the P & N regions results in a substantial enhancement in the photogeneration of charge carriers, and device output.

The art teaches several techniques for constructing amorphous silicon PIN devices. These techniques employ the glow discharge decomposition of silane to produce the n, p and intrinsic amorphous silicon layers. This deposition technique is best exemplified in U.S. Pat. No. 4,064,521 to Carlson, which describes a glow discharge produced PIN structure having photovoltaic efficiency in the range of 4 to 6%. A principal deficiency in the prior art PIN devices, as noted by David Carlson in the technical publication entitled "Factors Influencing the Efficiency of Amorphous Silicon Solar Cells", *Journal of Non-Crystalline Solids*, Vol. 35–36 (1980), pp. 707–717, is that for illumination through the p-layer the glow discharge deposition produces a p-layer which is both poorly conductive and absorbs the incident light energy without significantly contributing to the photogeneration of the charge carriers in the device. The poorer electronic properties of the P-layer originate from boron incorporation into the network that introduces defect states in the gap of the semiconductor, which act as recombination centers. In addition, these defect states induce optical absorption which make the effective optical gap of the P-layer to be smaller than that of the I-layer.

In contrast to such PIN devices, the present invention teaches an amorphous silicon PIN device having a p-region which is particularly constructed to have a wide band gap, resulting in a substantial transmission of light energy to the intrinsic layer. Furthermore, the construction techniques as taught herein, result in a p region, which apparently contributes to the collection of photogenerated carriers. The invention further teaches a particularly adapted construction of both the p- and n-layers to control the band gap of same, which should result in an increase in the open circuit voltage produced by the photovoltaic device.

SUMMARY OF THE INVENTION

The invention is directed to a hybrid construction amorphous silicon PIN device having an intrinsic (undoped) layer produced by glow discharge decomposition of silane while having at least the p-doped region constructed by reactive sputtering from a Si target in a plasma of Argon and hydrogen. The hybrid construction results in the ability to control the optical band gap of the p and n layers, resulting in an increased open circuit voltage, and in the case of the controlled optical band gap for the p-layer, overcoming the long standing drawback of absorption without substantial carrier generation by the p-layer. An attendant advantage in the construction of the p-layer is enhanced photogeneration of charge carriers within the p-layer itself.

DETAILED DESCRIPTION OF THE INVENTION

Figure 1:
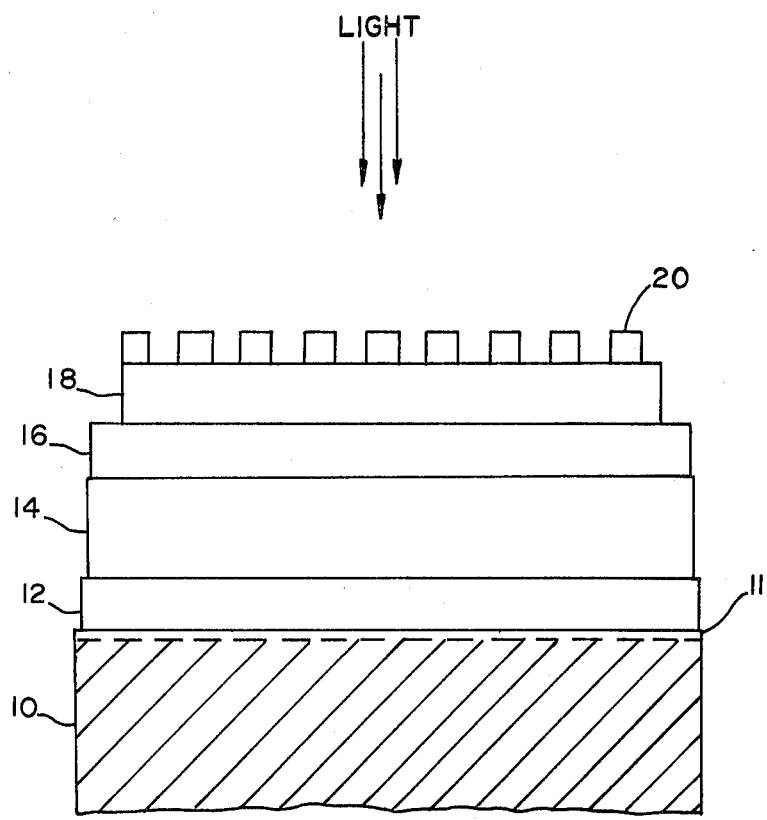
FIGS. 1 and 2 are greatly enlarged side, sectional views of a PIN and NIP amorphous silicon device in accordance with the present invention.

The present invention is directed to an improved amorphous silicon PIN device having increased photovoltaic response as evidenced by enhanced photo output in the blue spectral region. To illustrate this invention, in FIG. 1 there is shown a greatly enlarged side view of a PIN device. A substrate 10 generally comprises a physically supportive substrate for overlying layers of thin films. The substrate 10 includes a major area coating surface which is substantially free from voids or protrusions of the order (in size) of the thickness of the overlying layers, discussed hereinafter, to avoid pinholes therethrough. In the embodiment of FIG. 1, substrate 10 is illustrated as comprising a generally nontransparent material. In one embodiment, substrate 10 may comprise a non-electroconductive material such as a ceramic, for example, for which an overlying layer of electroconductive material 11 is required. Alternately, substrate 10 may comprise a metal serving both as a supportive substrate and as a current carrying electrode during the operation of the photovoltaic device. In either instance, the coating surface of the substrate is thoroughly cleaned to remove unwanted contamination and particulate from the coating surface. In a preferred embodiment, electrode 10 comprises a metal known to form an ohmic contact to N-doped silicon, such as molybdenum or stainless steel for example. In the instance where substrate 10 comprises a non-electroconductive material, it is preferred that layer 11 comprise a layer of metal known to form an ohmic contact to N-doped amorphous silicon such as the aforementioned molybdenum, or chromium, which may be deposited onto the substrate to a thickness of approximately 1,000 to 2,000 Å.

Layer 12 comprises N-doped hydrogenated amorphous silicon, ranging in thickness from about 100 Å to about 1000 Å, deposited onto the coating surface of the substrate. The term N-doped as described in relation to the art of hydrogenated amorphous silicon may be defined as a film of amorphous silicon which includes electronically acting dopants such as phosphorous, arsenic, and antimony which serve to move the Fermi level closer to the conduction band, thus enhancing the conductivity of the film.

N-doped layer 12 may be fabricated by the alternate techniques of reactive sputtering or glow discharge. An n-doped layer of hydrogenated amorphous silicon can be constructed by the glow discharge decomposition of silane containing an amount of phosphine doping gas. The deposition process includes the steps of first heating the substrate to a temperature of 200°–400° C. In one embodiment, the substrate can be sputter-etched in an Ar discharge to effect further cleaning. The feed gas consisting of 0.1 to 1% $PH_3$ in $SiH_4$ is then fed into the reactor and the pressure raised to the desired level, usually 10 to 1000 mTorr. Either DC or RF power is then applied to effect ionization of the gases. The film is allowed to grow to the desired thickness, usually 100–1000 Å, after which the power is removed.

The conductivity of these films are generally $10^{-2}$ $\Omega^{-1}$ cm$^{-1}$ and their optical gap is smaller than the corresponding intrinsic film. [Eg (intrinsic) > 1.7 ev, Eg (n-layer) < 1.7 ev.]

In an alternate embodiment, the n-layer of hydrogenated amorphous silicon may be constructed by reactive sputtering in partial pressures of hydrogen, argon and phosphine. The process of sputtering the n-layer includes: First, heating of the substrate to a temperature of 200° to 400° C. Both the target and the substrate are sputter-etched in an argon plasma. A gas mixture of phosphine, hydrogen and argon is established in the open sputtering chamber. The phosphine partial pressure ranges from $5 \times 10^{-6}$ to $5 \times 10^{-5}$ Torr, the hydrogen partial pressure ranges from $5 \times 10^{-4}$ to $2.0 \times 10^{-3}$ Torr, and the argon partial pressure ranges from $3 \times 10^{-3}$ to $15 \times 10^{-3}$ Torr. The polycrystalline silicon target, 5 inches in diameter, is situated about 4.5 cm from the substrate and is supplied with an RF power of between 100 to 300 watts. The n-layer is sputtered while applying a DC bias to the substrate ranging from about 0 volts to about +100 volts. The film is allowed to grow to the desired thickness, usually between 100 to 1000 Å. The conductivity of these films is about $10^{-2}$ $\Omega^{-1}$ cm$^{-1}$ and their optical gap varies between 1.6 to 1.9 eV depending on the amount of incorporated hydrogen.

Layer 14 of intrinsic hydrogenated amorphous silicon 14 comprises undoped amorphous silicon, ranging in thickness from about 0.2 microns to about 10 microns, deposited by the glow discharge decomposition of substantially undoped silane. The term intrinsic, as used herein, defines a region of amorphous silicon which is characterized as one containing a minimum of impurities such that the electronic properties are determined by the structure and Si and H content of the film. Good intrinsic films may also be defined as having a low density of states in the gap which indicates good structural properties. The construction of the intrinsic layer 14 by glow discharge decomposition of silane may be generally described as including the steps of first elevating the substrate temperature to a desired level, usually between 200°–400° C. The $SiH_4$ fuel is then fed into the reactor and the pressure brought to the desired level, usually 10–1000 mT. Either DC or RF power is then applied to start a glow discharge. The film is then allowed to grow to the desired thickness, usually 0.2–10 μm, after which the power is removed.

A layer of p-doped hydrogenated amorphous silicon 16 having a particularly adapted construction process as to provide control of the optical band gap of the material is then deposited onto intrinsic layer 14. The term p-doped, as defined in relation to the art of hydrogenated amorphous silicon, is characterized as a film of a-Si which contains electronically active dopants such as boron which serve to move the Fermi level closer to the valence band, thus enhancing the conductivity of the film. The p-layer, ranging in thickness from about 80 Å to about 300 Å, is reactively sputtered from a polycrystalline silicon target in partial pressures of hydrogen, argon and diborane. A preferred range in thickness for the p-layer is between about 80 Å and about 200 Å. The process of sputtering the p-layer includes the following steps. Maintain the substrate at the same temperature as during the deposition of the n and I layers. The three gases are premixed at certain partial pressures. The partial pressure of diborane ranges between $5 \times 10^{-6}$ to $5 \times 10^{-5}$ Torr; the partial pressure of hydrogen ranges between 0.5 to 2.0 mTorr and the partial pressure of argon ranges between 3 to 15 mTorr. The sputtering power and substrate bias conditions are identical to those described for the deposition of the n-layer. The p-layer is sputtered while applying a DC bias to the substrate ranging from about 0 volts to about +100 volts. The conductivity of these film are between $10^{-3}$ to $10^{-2}$ $\Omega^{-1}$ cm$^{-1}$ and their optical gap is larger than 1.8 ev. A preferred range for the optical gap is between about 1.8 ev and 2.0 ev.

The particularly adapted construction of the p-layer of hydrogenated amorphous silicon, as taught herein, results in a p-layer which not only enhances the open circuit voltage of the device as recognized by others in the art, but further provides a semiconductor "window layer", passing a substantial amount of incident light therethrough, to be absorbed in the highly photogenerative region of the underlying I-layer. The construction of the wide band gap p-layer as taught herein is accomplished without substantial addition of defect states to the amorphous silicon hydride, thereby preserving a high carrier lifetime of the layer and providing for a relatively high efficiency of boron doping of the region.

An ohmic electrode 18 may include a transparent conductive oxide such as indium tin oxide, cadmium stannate, or tin oxide. These n-type semiconductor oxides are recognized by those in the art as forming an ohmic contact to relatively heavily doped p-type amorphous silicon. Additionally, it is recognized that the refractive indices of these oxides provide a relatively good index of refraction matching to the surface of the p-type amorphous silicon, resulting in an anti-reflection coating. In the preferred embodiment, electrode 18 comprises a layer of indium tin oxide reactively sputtered from a sputtering target 5 inches in diameter and having a composition of $In_2O_3$/9M% $SnO_2$. The target is supplied with a power of 50 watts. During the deposition of ITO the substrate is heated to about 250° C. The thickness of the ITO layer is chosen to be between 500 to 700 Å. For relatively large area devices, the electroconductivity of layer 18 may be supplemented by a grid 20 comprising a highly electroconductive material, such as a noble metal for instance. Means for optimizing the grid pattern, grid thickness, and the means for constructing the grid itself, are well-known in the art of photovoltaic devices. Layers 12 and 16 in FIG. 1 may be inverted. In this case, the p-layer is sputtered first, followed by the glow discharge I-layer and the sputtered (or glow discharge) n-layer. The layers 18 and 20 remain the same.

Figure 2:
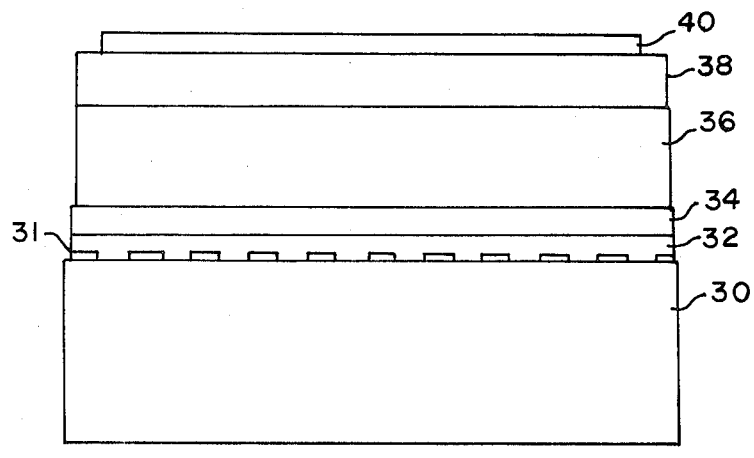

In the embodiment illustrated in FIG. 2, a substantially transparent substrate 30 permits illumination of the device through the substrate. Accordingly, substrate 30 is selected from materials exhibiting substantial transparency to light energy of wavelengths ranging from about 0.3 microns to about 2.0 microns. Suitable materials for use in substrate 30 include glass, quartz and sapphire, for example. As described heretofore for the embodiment of FIG. 1, the coating surface of substrate 30 is scrupulously cleaned to remove particulates, etc. which may result in pinholes through the overlying thin film layers. A semitransparent conductive oxide layer 32 is deposited on the substrate 30. The conductive oxide is chosen to provide an ohmic contact to a layer p-doped amorphous silicon deposited thereon. Examples of such oxide include indium tin oxide, cadmium stannate, or antimony doped tin oxide. For relatively large area devices, the conductivity of layer 32 may be supplemented by grid layer 31, comprising a highly electroconductive metal, for example, nichrome, silver, etc.

A layer of p-doped hydrogenated amorphous silicon 34 is reactively sputtered onto the surface of layer 32. The thickness of this layer is generally 100 A. The deposition parameters for layer 34 are substantially identical to those described for the p-layer of the previous embodiment illustrated as layer 16 of FIG. 1.

A layer of intrinsic amorphous silicon 36 is deposited onto layer 34 in ranges in thickness from about 0.2 microns to about 10 microns. Intrinsic layer 36 is constructed in substantially the identical manner as described for intrinsic layer 14 of the previous embodiment illustrated in FIG. 1. An n-doped layer of hydrogenated amorphous silicon 38 is deposited onto intrinsic layer 36 to a thickness ranging from about 200 Å to about 500 Å. As described for the intrinsic layer and p-layer, the construction of the n-doped layer is substantially identical to the n-doped layer described in the previous embodiment.

An ohmic contact 40 is selected from materials known to form an ohmic contact with n-doped amorphous, silicon, including chromium, molybdenum, etc. These layers are deposited either by evaporation or sputtering.

As described in the previous embodiment, the particularly adapted construction of the p-doped layer 34 results in a wide band gap semiconductor having improved photogeneration and doping efficiency characteristics, resulting in an amorphous silicon PIN device having both increased open circuit voltage and enhanced blue response.

Figure 3:
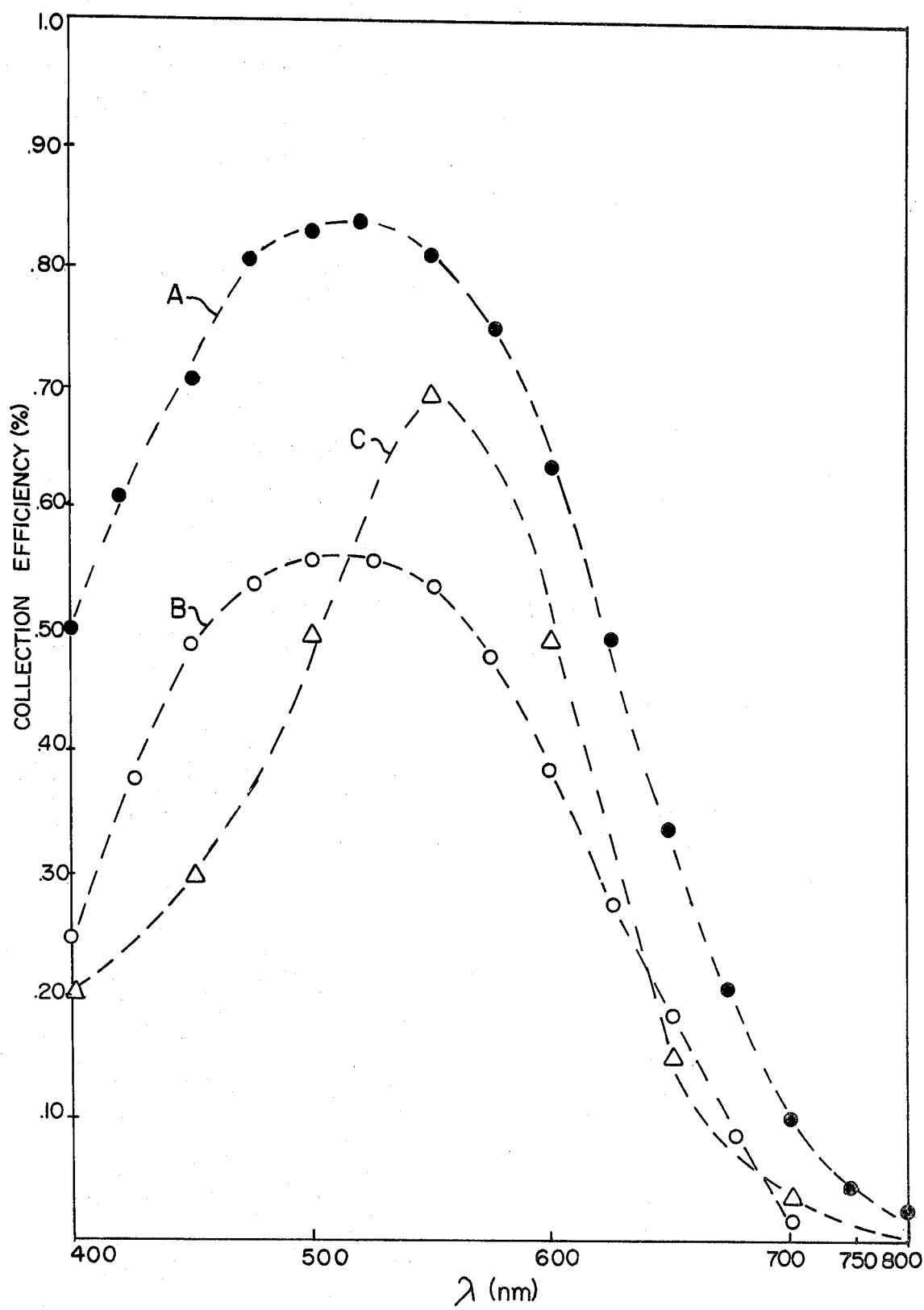
FIG. 3 is a graphic plot of the photovoltaic response of a PIN device produced in accordance with the present invention compared with PIN device known in the art.

Referring momentarily to FIG. 3, there is shown at traces B and C a collection efficiency spectra generally characterizing the spectral photo-response of prior art PIN devices illunimated from the P-side. These devices show poor collection efficiency at short wavelengths due to the absorption of light in the P-layer. Shown in contrast thereto is spectrum A of an improved PIN device constructed in accordance with the present invention, exhibiting substantially increased photoresponse in the whole wavelength region.

What is claimed is:

1. A method for producing a hydrogenated amorphous silicon PIN photovoltaic device exhibiting increased blue photoresponse, said method comprising the steps of:

providing a substrate having at least a region of a first electroconductive material which forms an ohmic contact to n-doped amorphous silicon;

depositing a layer of n-doped hydrogenated amorphous silicon onto said ohmic contact;

depositing a layer of undoped, intrinsic hydrogenated amorphous silicon onto said n-doped layer by means of glow discharge decomposition of silane;

reactively sputter depositing a layer of p-doped hydrogenated amorphous silicon onto said intrinsic layer, said p-doped layer forming a semiconductor junction with said intrinsic layer and having an optical gap greater than 1.8 ev;

depositing a layer of a second electroconductive material onto said p-layer, said material forming an ohmic contact thereto.

2. The method of claim 1, wherein said step of depositing an n-doped layer comprises reactively sputtering a silicon target in partial pressures of at least hydrogen, argon and phosphine.

3. The method of claim 2 wherein said partial pressure of hydrogen ranges from about 0.5 mTorr to about 2.0 mTorr.

4. The method of claim 2 wherein said partial pressure of argon ranges from about 3 mTorr to about 15 mTorr.

5. The method of claim 2 wherein said partial pressure of phosphine ranges from about $5 \times 10^{-6}$ Torr to $5 \times 10^{-5}$ Torr.

6. The method of claim 2 wherein said n-doped layer is sputter deposited from a polycrystalline silicon target situated a distance of about 4.5 cm from said substrates.

7. The method of claim 6 wherein said substrates are DC biased during said depositing at a voltage ranging from about 0 volts to about +100 volts.

8. The method of claim 2 wherein said n-doped layer is deposited to a thickness ranging from about 100 Angstroms to about 1000 Angstroms.

9. The method of claim 1 wherein said n-doped layer is deposited by glow discharge decomposition of silane containing an amount of phosphine sufficient to dope said hydrogenated amorphous silicon n-type.

10. The method of claim 9 wherein said silane contains 0.1 to 1% phosphine.

11. The method of claim 1 wherein said p-doped layer is reactively sputter deposited in partial pressures of hydrogen, argon and diborane.

12. The method of claim 11 wherein said partial pressure of hydrogen ranges from about 0.5 mTorr to about 2.0 mTorr.

13. The method of claim 11 wherein said partial pressure of argon ranges from about 3 mTorr to about 15 mTorr.

14. The method of claim 11 wherein said partial pressure of diborane ranges from about $5 \times 10^{-6}$ Torr to $5 \times 10^{-5}$ Torr.

15. The method of claim 11 wherein said substrates are biased during said step of depositing the p-layer at a DC voltage ranging from about 0 volts to about +100 volts to selectably control the optical band gap value of said p layer in the range from about 1.8 ev to about 2.0 ev.

16. The method of claim 11 wherein said p-doped layer ranges in thickness from about 80 angstroms to about 200 angstroms.

17. The method of claim 1 wherein said second electroconductive layer comprises a semi-transparent conductive oxide.

18. The method of claim 17 wherein said oxide comprises indium tin oxide.

19. The method of claim 18 wherein said indium tin oxide is sputter deposited.

* * * * *